(12) United States Patent
de Ceuster et al.

(10) Patent No.: US 8,409,912 B2
(45) Date of Patent: *Apr. 2, 2013

(54) BACK SIDE CONTACT SOLAR CELL STRUCTURES AND FABRICATION PROCESSES

(75) Inventors: Denis de Ceuster, Woodside, CA (US); Peter John Cousins, Menlo Park, CA (US); Richard M. Swanson, Los Altos Hills, CA (US); Jane E. Manning, Woodside, CA (US)

(73) Assignee: SunPower Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/883,035

(22) Filed: Sep. 15, 2010

(65) Prior Publication Data

US 2011/0000540 A1 Jan. 6, 2011

Related U.S. Application Data

(63) Continuation of application No. 11/643,743, filed on Dec. 20, 2006, now Pat. No. 7,820,475.

(60) Provisional application No. 60/752,664, filed on Dec. 21, 2005.

(51) Int. Cl.
*H01L 21/00* (2006.01)
(52) U.S. Cl. ............ 438/98; 257/465; 257/E31.13
(58) Field of Classification Search ............ 257/465, 257/430–461; 438/98, 71, 87
See application file for complete search history.

(56) References Cited

U.S. PATENT DOCUMENTS

| 4,478,879 A | 10/1984 | Baraona et al. |
| 4,479,027 A * | 10/1984 | Todorof ................. 136/249 |
| 4,927,770 A | 5/1990 | Swanson |
| 5,053,083 A | 10/1991 | Sinton |
| 5,164,019 A | 11/1992 | Sinton |

(Continued)

FOREIGN PATENT DOCUMENTS

| CN | 1241298 A | 1/2000 |
| JP | 2001-267610 A | 9/2001 |
| JP | 2004-221149 A | 8/2004 |
| JP | 2006-310373 A | 11/2006 |

OTHER PUBLICATIONS machine translation of Hitachi, JP2004 221149.*

(Continued)

*Primary Examiner* — Julio J. Maldonado
*Assistant Examiner* — Sonya McCall Shepard
(74) *Attorney, Agent, or Firm* — Okamoto & Benedicto LLP

(57) ABSTRACT

In one embodiment, active diffusion junctions of a solar cell are formed by diffusing dopants from dopant sources selectively deposited on the back side of a wafer. The dopant sources may be selectively deposited using a printing method, for example. Multiple dopant sources may be employed to form active diffusion regions of varying doping levels. For example, three or four active diffusion regions may be fabricated to optimize the silicon/dielectric, silicon/metal, or both interfaces of a solar cell. The front side of the wafer may be textured prior to forming the dopant sources using a texturing process that minimizes removal of wafer material. Openings to allow metal gridlines to be connected to the active diffusion junctions may be formed using a self-aligned contact opening etch process to minimize the effects of misalignments.

14 Claims, 10 Drawing Sheets

U.S. PATENT DOCUMENTS

| | | | |
|---|---|---|---|
| 5,360,990 | A | 11/1994 | Swanson |
| 5,369,291 | A | 11/1994 | Swanson |
| 5,641,362 | A | 6/1997 | Meier |
| 6,096,968 | A | 8/2000 | Schlosser et al. |
| 6,180,869 | B1 | 1/2001 | Meier et al. |
| 6,274,402 | B1 | 8/2001 | Verlinden et al. |
| 6,313,395 | B1 | 11/2001 | Crane et al. |
| 6,333,457 | B1 | 12/2001 | Mulligan et al. |
| 6,337,283 | B1 | 1/2002 | Verlinden et al. |
| 6,387,726 | B1 | 5/2002 | Verlinden et al. |
| 6,423,568 | B1 | 7/2002 | Verlinden et al. |
| 6,552,414 | B1 | 4/2003 | Horzel et al. |
| 6,872,321 | B2 | 3/2005 | Thavarajah et al. |
| 6,998,288 | B1 | 2/2006 | Smith et al. |
| 7,820,475 | B2 | 10/2010 | De Ceuster et al. |
| 2004/0259335 | A1 | 12/2004 | Narayanan et al. |
| 2008/0035198 | A1 | 2/2008 | Teppe et al. |

OTHER PUBLICATIONS

W.P. Mulligan, et al. "A Flat-Plate Concentrator: Micro-Concentrator Design Overview", 2000, 3 sheets, Proceedings of the 28th IEEE PVSC.

K. R. McIntosh, et al. "The Choice of Silicon Wafer for the Production of Low-Cost Rear-Contact Solar Cells", May 2003, 4 sheets, Sunpower Corporation, Sunnyvale, CA.

P.J. Verlinden, et al. "Will We have a 20%-Efficient(PTC) Photovoltaic System?", 2001, 6 sheets, Proceedings of the 17th Europe Photovoltaic Solar Energy Conference.

William P. Mulligan, et al. " Development of Chip-Size Silicon Solar Cells", 2000, 6 sheets, Proceedings of the 28th IEEE PVSC.

Akira Terao, et al. "A Mirror-Less Design for Micro-Concentrator Modules", 2000, 4 sheets, Proceedings of the 28th IEEE PVSC.

P.J. Verlinden, et al. "Backside-Contact Silicon Solar Cells with Improved Efficiency for the '96 World Solar Challenge", 1997, 5 sheets, Proceedings of the 15th EPSEC.

P.J. Verlinden, et al. "One-Year Comparison of a Concentrator Module with Silicon Point-Contact Solar Cell to a Fixed Flat Plate Module in Northern California", 2000, 4 sheet, Proceedings of the 16th EPSEC.

Richard M. Swanson, "The Promise of Concentrators", 2000, Prog. Photovolt. Res. Appl. 8, pp. 93-111 (2000), Sunpower Corporation, Sunnyvale, CA.

Ronald A. Sinton, et al. "Simplified Backside-Contact Solar Cells", Feb. 1990, pp. 348-352, IEEE Transactions on Electron Devices, vol. 37. No. 2.

Ronald A. Sinton, "Device Physics and Characterization of Silicon Point-Contact Solar Cells", Feb. 1997, pp. 1-154, Stanford Electronics Laboratories, Stanford University, CA.

Richard Roland King, "Studies of Oxide-Passivated Emitters in Silicon and Applications to Solar Cells", Aug. 1990, pp. 1-200, (Thesis) Electrical Engineering Department of Stanford University, CA.

J.Y. Lee, et al. "Boron-Back Surface Field With Spin-On Dopants by Rapid Thermal Processing", Jun. 2004, pp. 998-1001, 19th European Photovoltaic Solar Energy Conference, Paris, France.

Mawuli Ametowabla, et al. "Laser Processing of Crystalline Silicon Solar Cells" Jan. 3, 2005, pp. 1277-1280, Conference Record of the Thirty-First IEEE Photovoltaic Specialist Conference, XP010822989.

Extended EPO Search Report for EP Application No. 06 847 829.6 (PCT/US2006/048607), Feb. 15, 2012, 8 pgs.

* cited by examiner

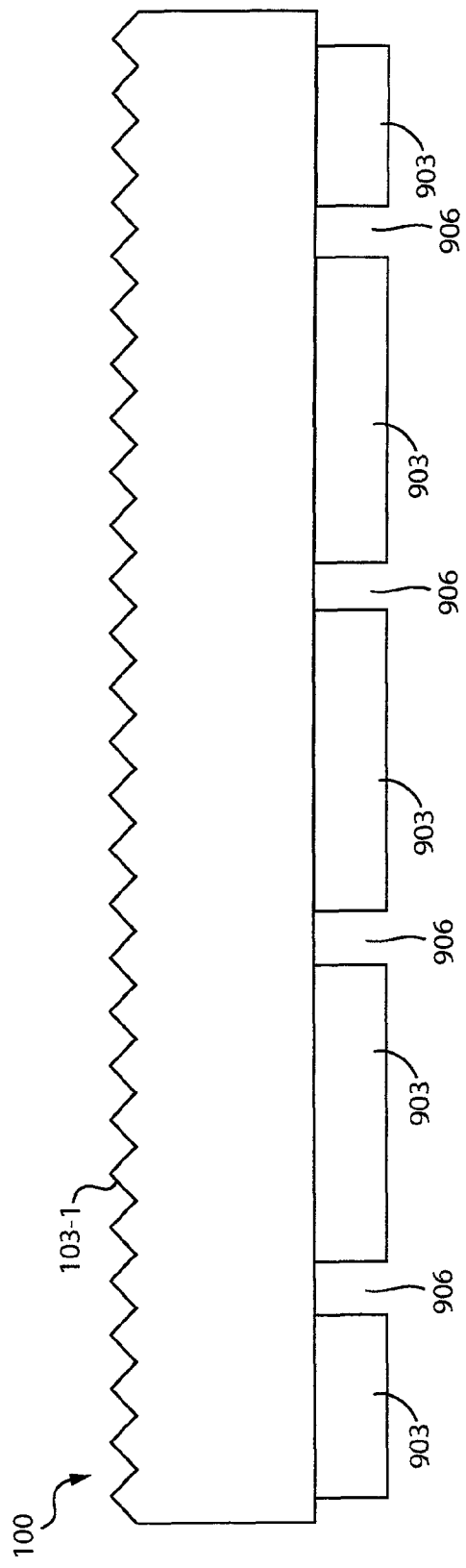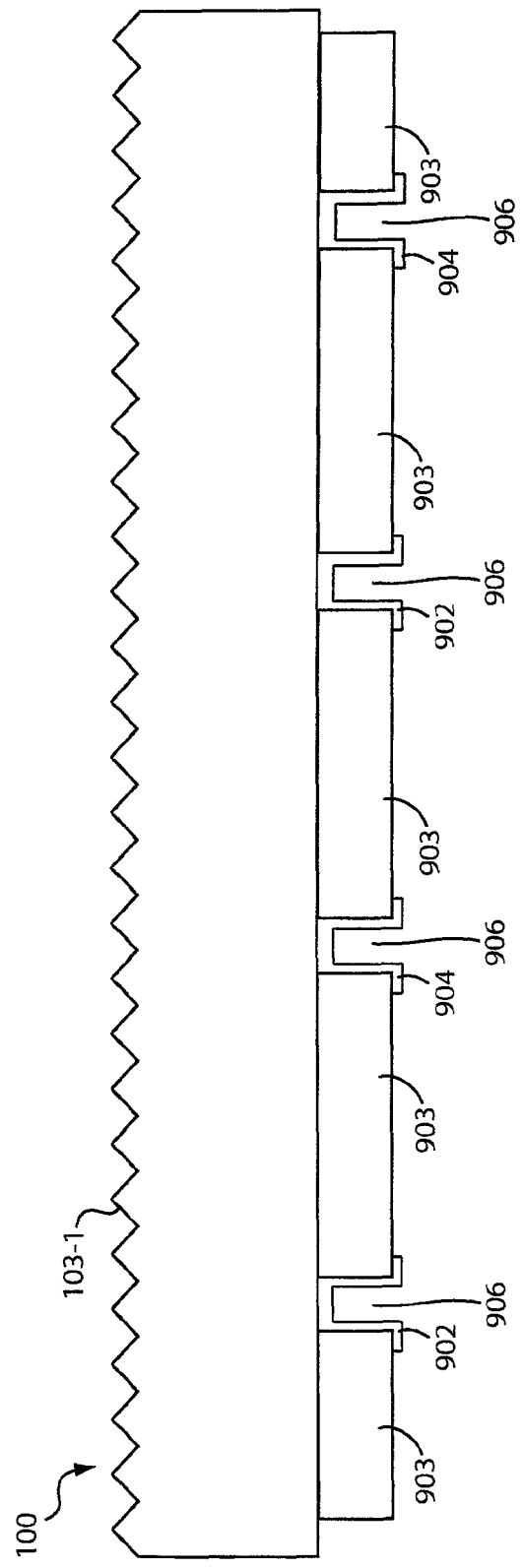

BACK SIDE CONTACT SOLAR CELL STRUCTURES AND FABRICATION PROCESSES

CROSS-REFERENCE TO RELATED APPLICATIONS

This application is a continuation of U.S. application Ser. No. 11/643,743, filed Dec. 20, 2006, now U.S. Pat. No. 7,820,475, which claims the benefit of U.S. Provisional Application No. 60/752,664, filed Dec. 21, 2005, both of which are incorporated herein by reference in their entirety.

BACKGROUND OF THE INVENTION

1. Field of the Invention

The present invention relates generally to solar cells, and more particularly but not exclusively to back side contact solar cell structures and fabrication processes.

2. Description of the Background Art

Solar cells are well known devices for converting solar radiation to electrical energy. They may be fabricated on a semiconductor wafer using semiconductor processing technology. Generally speaking, a solar cell may be fabricated by forming P-type and N-type active diffusion regions in a silicon substrate. Solar radiation impinging on the solar cell creates electrons and holes that migrate to the active diffusion regions, thereby creating voltage differentials between the active diffusion regions. In a back side contact solar cell, both the active diffusion regions and the metal grids coupled to them are on the back side of the solar cell. The metal grids allow an external electrical circuit to be coupled to and be powered by the solar cell. Back side contact solar cells are also disclosed in U.S. Pat. Nos. 5,053,083 and 4,927,770, which are both incorporated herein by reference in their entirety.

Efficiency is an important characteristic of a solar cell as it is directly related to the solar cell's capability to generate power. Accordingly, techniques for increasing the efficiency of solar cells are generally desirable. Methods and structures for lowering the cost of manufacturing solar cells are also desirable as the savings can be passed on to consumers. The present invention discloses improved back side contact cell structures and fabrication processes that allow for higher efficiency and lower cost compared to conventional solar cells.

SUMMARY

In one embodiment, active diffusion junctions of a solar cell are formed by diffusing dopants from dopant sources selectively deposited on the back side of a wafer. The dopant sources may be selectively deposited using a printing method, for example. Multiple dopant sources may be employed to form active diffusion regions of varying doping levels. For example, three or four active diffusion regions may be fabricated to optimize the silicon/dielectric, silicon/metal, or both interfaces of a solar cell. The front side of the wafer may be textured prior to forming the dopant sources using a texturing process that minimizes removal of wafer material. Openings to allow metal gridlines to be connected to the active diffusion junctions may be formed using a self-aligned contact opening etch process to minimize the effects of misalignments.

These and other features of the present invention will be readily apparent to persons of ordinary skill in the art upon reading the entirety of this disclosure, which includes the accompanying drawings and claims.

The use of the same reference label in different drawings indicates the same or like components. Drawings are not necessarily to scale unless otherwise noted.

DETAILED DESCRIPTION

In the present disclosure, numerous specific details are provided, such as examples of structures and fabrication steps, to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

The present disclosure relates to the fabrication of solar cells. Solar cell fabrication processes are also disclosed in the following commonly-assigned disclosures, which are incorporated herein by reference in their entirety: U.S. application Ser. No. 10/412,638, entitled "Improved Solar Cell and Method of Manufacture," filed on Apr. 10, 2003 by William P.

Mulligan, Michael J. Cudzinovic, Thomas Pass, David Smith, Neil Kaminar, Keith McIntosh, and Richard M. Swanson; U.S. Publication No. 2004/0200520 (application Ser. No. 10/412,711), entitled "Metal Contact Structure For Solar Cell And Method Of Manufacture," filed on Apr. 10, 2003 by William P. Mulligan, Michael J. Cudzinovic, Thomas Pass, David Smith, and Richard M. Swanson; and U.S. Pat. No. 6,998,288 issued to Smith et al.

In the manufacture of solar cells, it may be desirable to texture the front side (i.e., the side facing the sun during normal operation) of the solar cell with random pyramids for improved solar radiation collection efficiency. The texturing process may comprise a wet etch process using potassium hydroxide and isopropyl alcohol. The back side (i.e., the side opposite the front side) of the solar cell may be covered by a protective layer of silicon dioxide to prevent it from being damaged by the texturing process. While effective for the most part, the just described texturing process may be improved by performing it prior to processing the back side of the solar cell to minimize the amount of material removed from the wafer prior to texturing as described in FIGS. 1A-1D.

Figure 1A:
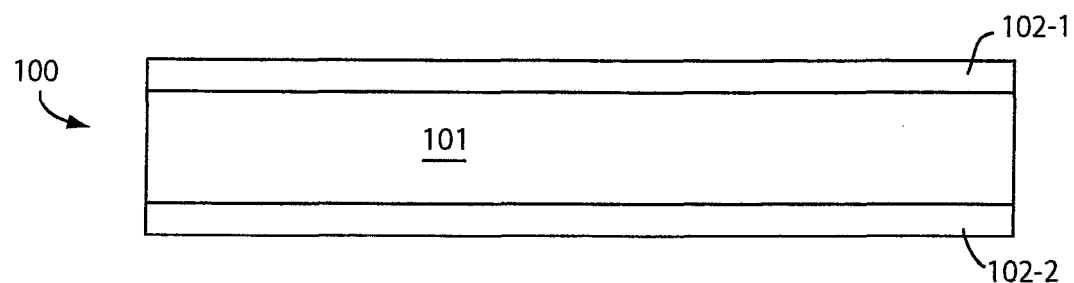
FIG. 1, which consists of FIGS. 1A, 1B, 1C, and 1D, schematically shows cross-sections of a substrate undergoing a texturing process in accordance with an embodiment of the present invention.

FIG. 1, which consists of FIGS. 1A, 1B, 1C, and 1D, schematically shows cross-sections of a substrate undergoing a texturing process in accordance with an embodiment of the present invention. In one embodiment, the substrate comprises an N-type silicon wafer 100. In FIG. 1A, the wafer 100 is unprocessed and has just been received from the wafer vendor or manufacturing plant. Accordingly, the wafer 100 still has damaged portions 102 (i.e., 102-1, 102-2) along with a bulk, undamaged portion 101. The damaged portions 102 are typically due to the sawing process used to slice the wafer 100 from its ingot. The total thickness of the wafer 100 may be around 200 pm at this stage.

Figure 1B:
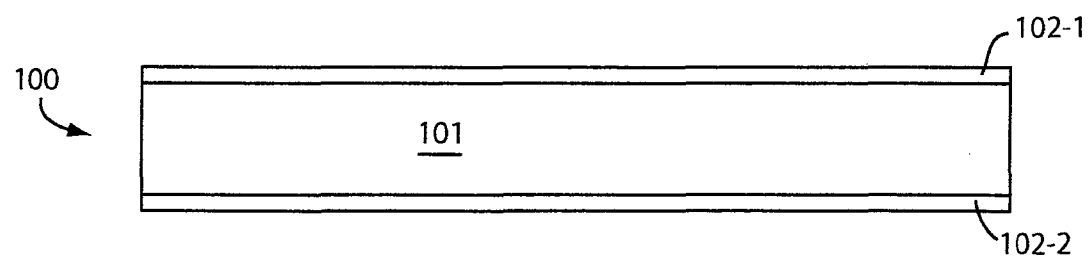

In FIG. 1B, each of the damaged portions 102 is partially removed. That is, both sides of the wafer 100 are thinned to remove some, but not all, of the damaged portions 102. In one embodiment, about 10 µm are removed from each side of the wafer 100 using a wet etch process comprising potassium hydroxide or sodium hydroxide.

Figure 1C:
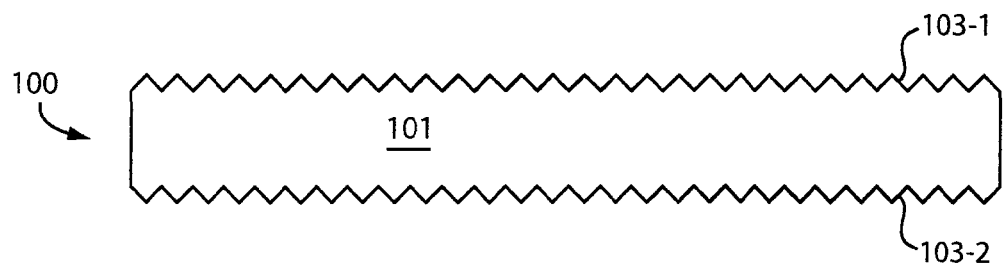

In FIG. 1C, both sides of the wafer 100 are textured in a process that also removes all of the remaining damaged portions 102. In one embodiment, both sides of the wafer 100 are textured with random pyramids using a wet etch process comprising potassium hydroxide and isopropyl alcohol. The texturing process may remove about 10 µm of material from both sides of the wafer 100, thus removing all of the remaining damaged portions 102. The textured front side of the wafer 100 is now labeled as 103-1, while the textured back side of the wafer 100 is labeled as 103-2.

Figure 1D:
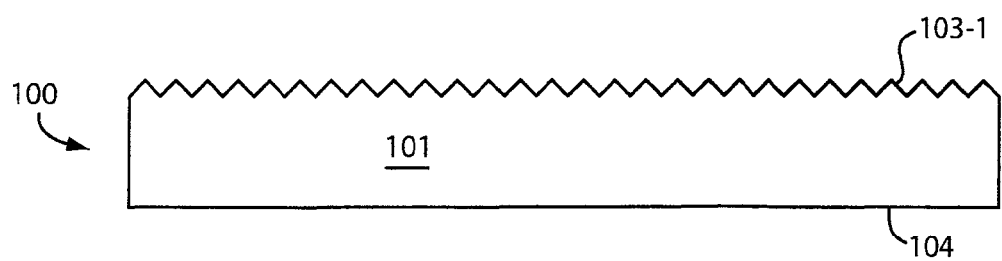

In FIG. 1D, the back side of the wafer 100 is polished and cleaned, resulting in a polished surface 104. The front side 103-1 faces the sun to collect solar radiation during normal operation. As will be more apparent below, active diffusion regions will be formed from the back side of the wafer, which is opposite the front side 103-1. The steps of partially removing damaged portions 102 on both sides of the wafer 100 (FIG. 1B), texturing both sides of the wafer 100 and removing the remaining damaged portions 102 at the same time (FIG. 1C), and polishing the backside of the wafer 100 may be performed in a single processing tool where the wafer 100 is moved from one step to another.

The polishing of the backside of the wafer 100 may be performed by single sided etching of the back side. For example, the single sided etching of the back side may be performed in a horizontal etcher, i.e. a tool where wafers are horizontally transported on a conveyor over tanks containing etching solutions. The tool may be configured such that only the back side of the wafer is in contact with the etching solution. Singe sided etching may also be accomplished by reactive ion etching (or "plasma etching"). The polishing of the backside of the wafer by single sided etching facilitates subsequent patterning operations and improves the recombination properties of the backside diffusions. From FIG. 1D, the wafer 100 may be subsequently processed to complete the solar cell as follows.

FIGS. 2-9 schematically show cross-sections of a back side contact solar cell being manufactured in accordance with embodiments of the present invention. FIGS. 2-9 are explained using the wafer 100 from FIG. 1D. As mentioned, the wafer 100 may comprise an N-type silicon wafer. The polarity of the dopants and the diffusion regions in the below examples may be changed to accommodate a P-type wafer. In general, suitable dopants for P-type dopant sources may include boron, while suitable dopants for N-type dopant sources may include phosphorus.

Figure 2A:
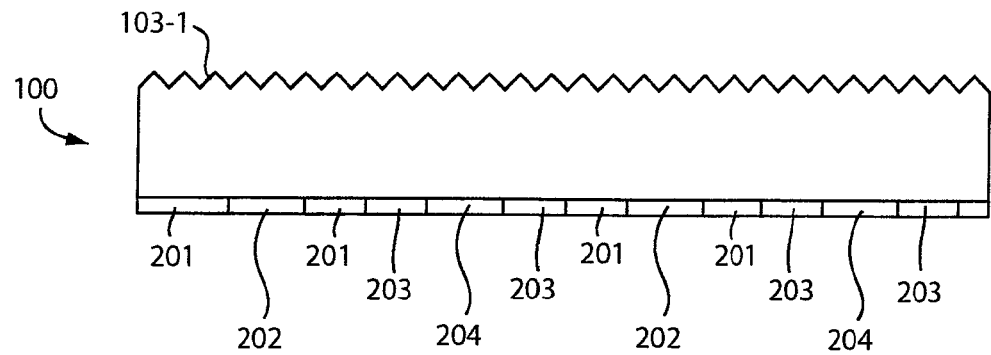
FIG. 2, which consists of FIG. 2A and FIG. 2B, illustrates the fabrication of active diffusion regions of a back side contact solar cell using adjacent selectively deposited dopant sources in accordance with an embodiment of the present invention.
Figure 2B:
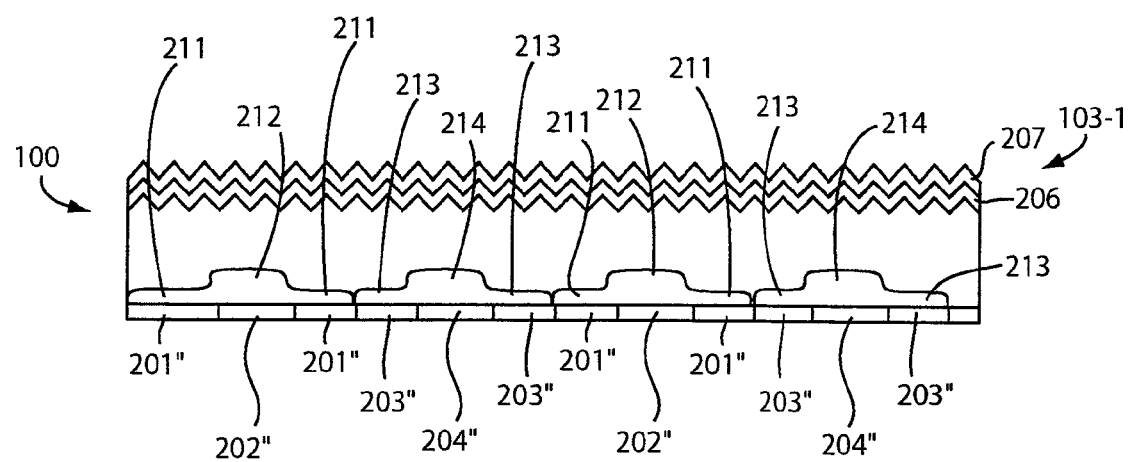

FIG. 2, which consists of FIG. 2A and FIG. 2B, illustrates the fabrication of active diffusion regions of a back side contact solar cell using adjacent selectively deposited dopant sources. The dopant sources 201-204 are selectively deposited in that they are not formed by blanket deposition followed by patterning. In FIG. 2A, dopant sources 201-204 are selectively deposited by directly printing them on the back side of the wafer 100, which is opposite the front side 103-1. The dopant sources 201-204 may be printed by industrial inkjet printing or screen printing. For example, each of dopant sources 201-204 may be discharged by different print heads or different groups of nozzles of the same print head. The dopant sources 201-204 may be printed in one pass or multiple passes of one or more print heads.

In FIG. 2 and following embodiments of the present invention, suitable materials for inkjet printing of dopant sources may include appropriately doped combination of solvent (for instance IPA), organo siloxane, and a catalyst, while suitable materials for screen printing of dopant sources may include appropriately doped combination of solvent, organo siloxane, catalyst and fillers such as $Al_2O_3$, $TiO_2$, or $SiO_2$ particles.

An additional layer (not shown) of a protective material, such as silicon dioxide, may be formed on the dopant sources 201-204 to provide electrical isolation, reduce recombination at the silicon interface, or to prevent dopant cross-contamination, as needed. The dopant sources 201 and 202 may comprise an N-type dopant, such as phosphorus, with the dopant source 201 being lightly doped (N−) and the dopant source 202 being heavily doped (N+). The dopant sources 203 and 204 may comprise a P-type dopant, such as boron, with the dopant source 203 being lightly doped (P−) and the dopant source 204 being heavily doped (P+). In one embodiment, the dopant sources 201-204 may be printed to a thickness of about 5 microns.

In FIG. 2B, the sample of FIG. 2A is placed in a furnace and subjected to high temperatures to diffuse dopants from the dopant sources 201-204 into the wafer 100. Diffusion of dopants from dopant sources 201-204 results in the formation of active diffusion regions 211-214, respectively, in the wafer 100. The diffusion step of FIG. 2B and embodiments disclosed below may be a single step drive-in of dopants into the wafer 100 because all dopant sources have been formed prior to the diffusion step. The single step drive-in may also electrically activate the diffused dopants to form active diffusion regions.

The dopant sources 201 and 203 may be lightly doped such that the resulting diffusion regions 211 and 213, respectively, have a resistivity of about 250 ohm/sq, for example. The dopant sources 202 and 204 may be heavily doped such that the resulting diffusion regions 212 and 214, respectively, have a resistivity of about 10 ohm/sq, for example. The dopant sources 201-204 have been relabeled with double primes (i.e., 201"-204") to reflect that their dopants have been driven into the wafer 100 during the diffusion step. Presence of phosphorus-rich gas in the furnace while the wafer 100 is subjected to high temperatures diffuses phosphorus into the front side 103-1 to form an N-type region 206. Additionally, oxygen may be introduced into the furnace to form a thermal oxide layer 207 also on the front side 103-1. The formation of the N-type region 206 and the thermal oxide layer 207 on the front side 103-1 may be formed at the same time and in-situ with the back side diffusion step in the example of FIG. 2B and other embodiments explained below.

From FIG. 2B, a backend process may be performed to couple metal grid lines to the heavily doped diffusion regions 212 and 214. Such a backend process may comprise formation of an anti-reflective coating on the front side 103-1, formation of a contact mask to form contact openings on the back side, a contact etch step to form the contact openings, removal of the contact mask, and plating gridlines to respective diffusion regions through the contact openings. Such a backend process may also be performed to couple metal gridlines to diffusion regions in other embodiments disclosed below. Other suitable backend processes may also be used.

Figure 3A:
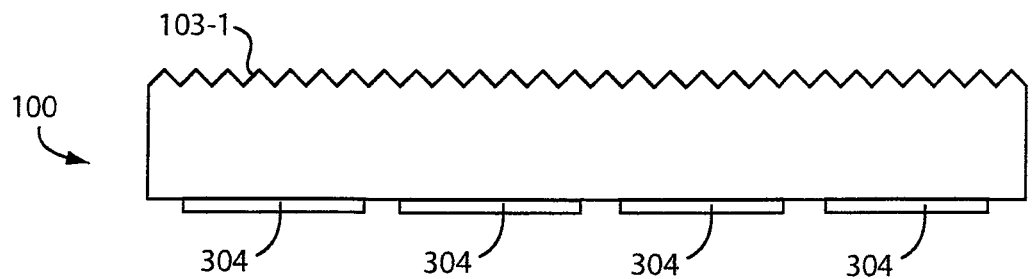
FIG. 3, which consists of FIGS. 3A-3C, illustrates the fabrication of active diffusion regions of a back side contact solar cell using overlapping selectively deposited dopant sources in accordance with an embodiment of the present invention.
Figure 3B:
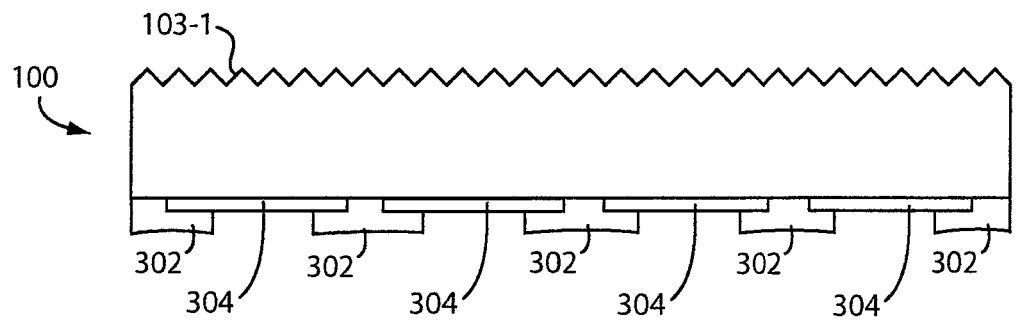
Figure 3C:
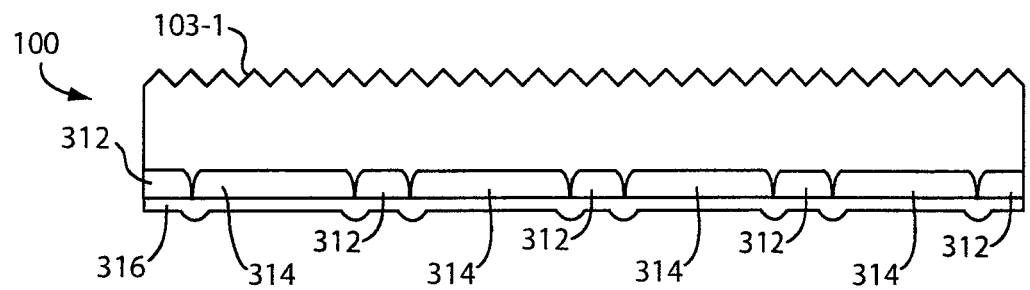

FIG. 3, which consists of FIGS. 3A-3C, illustrates the fabrication of active diffusion regions of a back side contact solar cell using overlapping selectively deposited dopant sources. In FIG. 3A, dopant sources 304 are selectively deposited on the back side of the wafer 100, which is opposite the front side 103-1. The dopant sources 304 may be doped with a P-type dopant and selectively deposited to a thickness of about 5 microns. In FIG. 3B, the dopant sources 302 are selectively deposited on portions of the back side not covered by the dopant sources 304 and over some portions of the dopant sources 304. Selective deposition over portions of the dopant sources 304 advantageously makes the selective deposition of the dopant sources 302 less sensitive to alignment variations. The dopant sources 302 may be doped with an N-type dopant and selectively deposited to a thickness of about 5 microns. The dopant sources 302 and 304 may be selectively deposited by inkjet printing or screen printing, for example. A curing process may be performed after deposition of each the dopant sources 302 and 304. In FIG. 3C, a diffusion step is performed to diffuse dopants from the dopant sources 302 and 304 into the wafer 100. The diffusion step results in the diffusion of P-type dopants from the dopant sources 304 to the wafer 100 to form P+ active diffusion regions 314, and the diffusion of N-type dopants from the dopant sources 302 to the wafer 100 form N+ active diffusion regions 312.

Figure 4A:
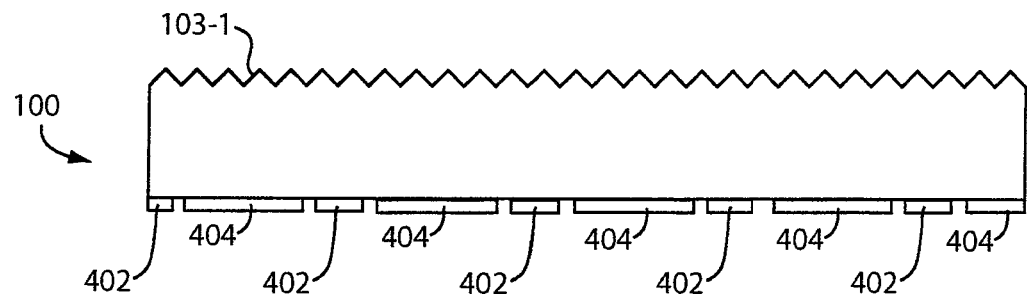
FIG. 4, which consists of FIGS. 4A and 4B, illustrates the fabrication of active diffusion regions of a back side contact solar cell using spaced selectively deposited dopant sources in accordance with an embodiment of the present invention.
Figure 4B:
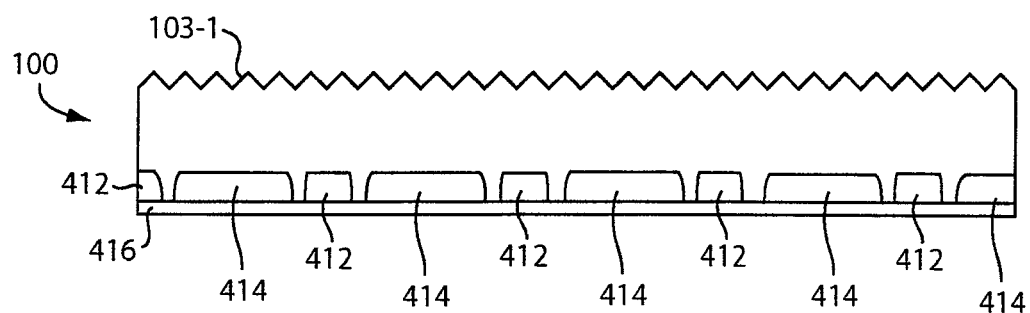

FIG. 4, which consists of FIGS. 4A and 4B, illustrates the fabrication of active diffusion regions of a back side contact solar cell using spaced selectively deposited dopant sources. Leaving a gap between selectively deposited dopant sources may improve solar cell efficiency in applications where butting of P-type and N-type active diffusion regions introduces a large recombination current. In FIG. 4A, dopant sources 402 and 404 are selectively deposited on the back side of the wafer 100 by inkjet printing or screen printing. The dopant sources 402 and 404 may be selectively deposited to a thickness of about 5 microns in a single pass of a printing process, for example. The dopant sources 402 may be doped with an N-type dopant, while the dopant sources 404 may be doped with a P-type dopant. A gap about 3 microns or more, dictated by the alignment tolerance of the patterning technique, may be present between dopant sources 402 and 404. In FIG. 4B, a diffusion step is performed to diffuse dopants from the dopant sources 402 and 404 to the wafer 100. The diffusion step diffuses N-type dopants from the dopant sources 402 into the wafer 100 to form N+ active diffusion regions 412. Similarly, the diffusion step diffuses P-type dopants from the dopant sources 404 into the wafer 100 to form active diffusion regions 414. The diffusion step results in the dopant sources 402 and 404 transforming to a dielectric layer 416, which may comprise silicon glass.

In the fabrication of a solar cell, metal gridlines are formed to make contact to active diffusion regions to connect the solar cell to external devices. This results in both the P-type and N-type active diffusion regions being under silicon/dielectric and silicon/metal interfaces. Silicon/metal interfaces are unavoidable since contact must be made between the silicon and the metal grid. Minority carrier recombination velocities under silicon/dielectric interfaces can be made low (e.g., typically 10 cm/s under a thermally grown oxide) but are always very high under a silicon/metal interface. High surface recombination velocity negatively impacts device efficiency. Heavy and deep diffusions, which are also referred to as "opaque diffusions," reduce the impact of high surface recombination velocities by shielding the interface from the substrate. However, opaque diffusions also generate a high minority carrier recombination, which reduces device efficiency.

In accordance with an embodiment of the present invention, a higher efficiency back side contact solar cell can be made by forming active diffusion regions of varying doping levels, such as opaque diffusions under the silicon/metal interfaces and light, low recombination diffusions under silicon/dielectric interfaces, which do not need to be shielded as much. Selective deposition advantageously allows for cost-effective deposition of dopant sources with varying doping levels; otherwise, the masking and patterning steps that would have to be performed to lay down several dopant sources with varying doping levels would be cost prohibitive or would complicate the fabrication process. For example, selective deposition may be employed to form 4 different sets of dopant sources: (1) a lightly doped P-type dopant sources (P−) for forming a low recombination P-type active diffusions region under silicon/dielectric interfaces; (2) heavily doped P-type dopant sources (P+) for forming opaque P-type active diffusion regions under silicon/metal interfaces; (3) lightly doped N-type dopant sources (N−) for forming low recombination N-type active diffusion regions under silicon/dielectric interfaces; and (4) heavily doped N-type dopant sources (N+) for forming opaque N-type active diffusion regions under silicon/metal interfaces.

Figure 5A:
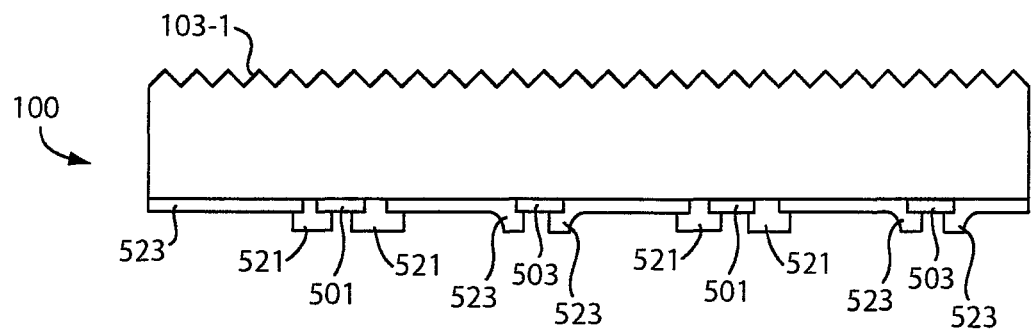
FIG. 5, which consists of FIGS. 5A and 5B, illustrates the fabrication of active diffusion regions of a back side contact solar cell using selectively deposited dopant sources with varying doping levels in accordance with an embodiment of the present invention.
Figure 5B:
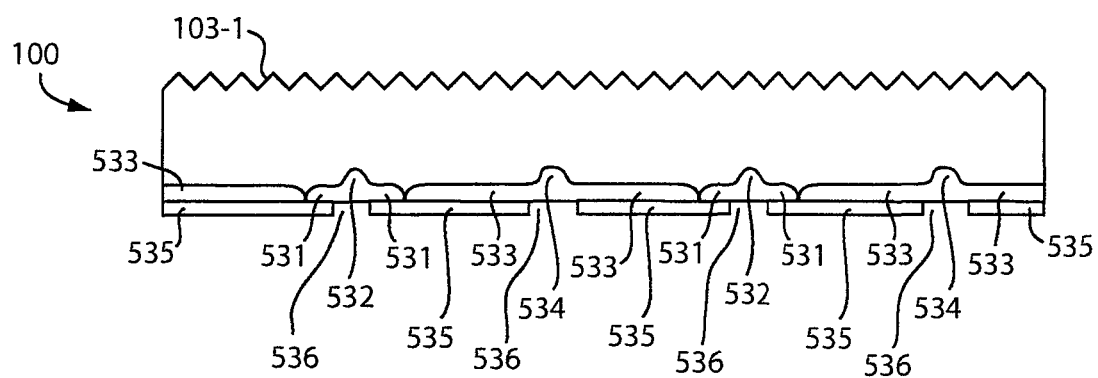

FIG. 5, which consists of FIGS. 5A and 5B, illustrates the fabrication of active diffusion regions of a back side contact solar cell using selectively deposited dopant sources with varying doping levels. In one embodiment, heavily doped dopant sources are formed over portions of the wafer 100 where active diffusion regions will contact a metal (i.e., under contact openings), and lightly doped dopant sources are formed over the other portions of the wafer 100.

In FIG. 5A, dopant sources 501, 503, 521, and 523 are selectively deposited on the back side of the wafer 100, which is opposite the front side 103-1. The dopant sources 501, 503, 521, and 523 may be configured to have light or heavy doping by adjusting their chemical composition or thickness. For example, the dopant sources 501 may be made thicker or have higher dopant concentration than the dopant sources 521. Similarly, the dopant sources 503 may be made thicker or have higher dopant concentration than the dopant sources 523. The dopant sources 501 may be heavily doped with an N-type dopant, the dopant sources 521 may be lightly doped with an N-type dopant, the dopant sources 503 may be heavily doped with a P-type dopant, and the dopant sources 523 may be lightly doped with a P-type dopant, for example. Selective deposition of dopant sources 501 and 503 may be performed in a first pass of a printing process, followed by selective deposition of the dopant sources 523 in a second pass of the printing process, followed by selective deposition of the dopant sources 521 in a third pass of the printing process.

In FIG. 5B, a diffusion step is performed to diffuse dopants from the dopant sources 501, 503, 521, and 523 into the wafer 100. The diffusion step results in the diffusion of N-type dopants from the dopant sources 501 to form N+ active diffusion regions 532, diffusion of N-type dopants from the dopant sources 521 to form N− active diffusion regions 531, diffusion of P-type dopants from the dopant sources 503 to form P+ active diffusion regions 534, and diffusion of P-type dopants from the dopant sources 523 to form P− active diffusion regions 533. Diffusion of dopants to the wafer 100 results in dopant sources 501, 503, 521, and 523 transforming into an undoped dielectric layer 535. Contact openings 536 are formed through the dielectric layer 535 to allow metal gridlines to contact the N+ active diffusion regions 532 and the P+ active diffusion regions 534.

In some applications, it may be desirable to form three, rather than four, different sets of active diffusion regions. For example, one of the lightly doped active diffusion regions of FIG. 5 may be eliminated as now described with reference to FIG. 6.

Figure 6A:
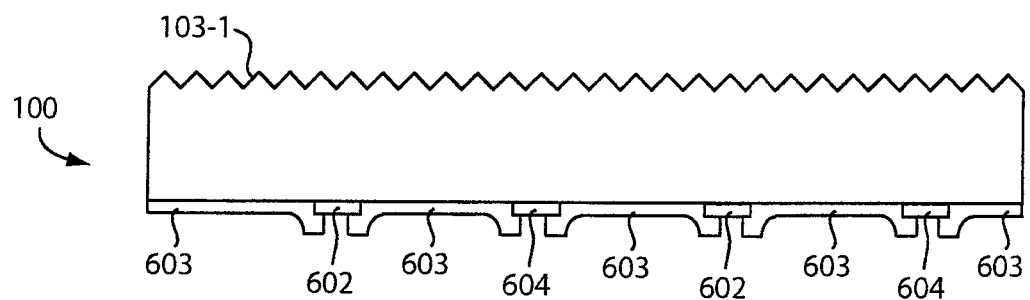
FIG. 6, which consists of FIGS. 6A and 6B, illustrates another way of forming active diffusion regions of a back side contact solar cell using selectively deposited dopant sources with varying doping levels in accordance with an embodiment of the present invention.
Figure 6B:
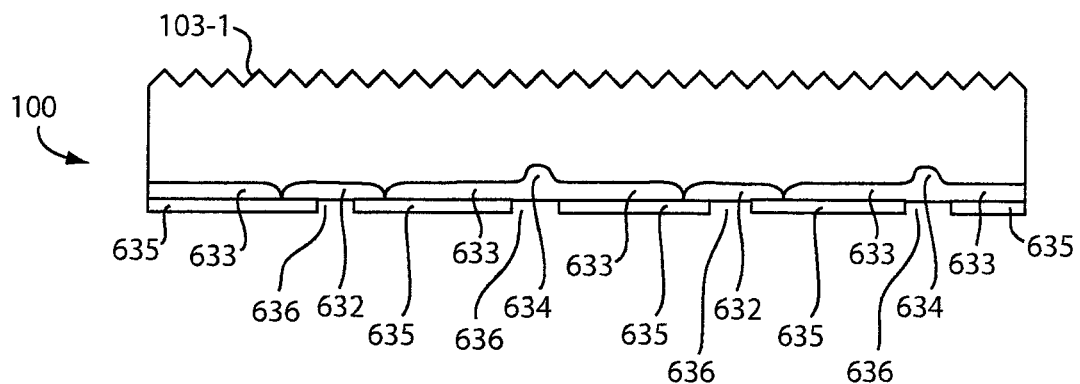

FIG. 6, which consists of FIGS. 6A and 6B, illustrates another way of forming active diffusion regions of a back side contact solar cell using selectively deposited dopant sources with varying doping levels. In FIG. 6A, dopant sources 602, 603, and 604 are selectively deposited on the back side of the wafer 100, which is opposite the front side 103-1. The dopant sources 602 may be heavily doped with an N-type dopant, the dopant sources 603 may be lightly doped with a P-type dopant, and the dopant sources 604 may be heavily doped with a P-type dopant, for example. Selective deposition of dopant sources 602 and 604 may be performed in a first pass of a printing process, followed by selective deposition of the dopant sources 603 in a second pass of the printing process.

In FIG. 6B, a diffusion step is performed to diffuse dopants from the dopant sources 602, 603, and 604 into the wafer 100. The diffusion step results in the diffusion of N-type dopants from the dopant sources 602 to form N+ active diffusion regions 632, diffusion of P-type dopants from the dopant sources 603 to form P− active diffusion regions 633, and diffusion of P-type dopants from the dopant sources 604 to form P+ active diffusion regions 634. Diffusion of dopants to the wafer 100 results in dopant sources 602, 603, and 604 transforming into an undoped dielectric layer 635. Contact openings 636 are formed through the dielectric layer 635 to allow metal gridlines to contact the N+ active diffusion regions 632 and the P+ active diffusion regions 634.

Besides selective deposition and chemical vapor deposition (CVD), spin coating may also be used to form dopant sources. For example, appropriately doped spin on glass (SOG) may be used as P-type and N-type dopant sources as in FIG. 7.

Figure 7A:
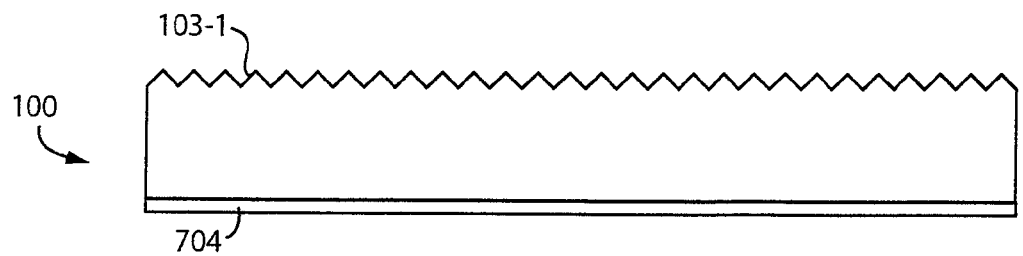
FIG. 7, which consists of FIGS. 7A, 7B, 7C, and 7D, illustrates the fabrication of active diffusion regions of a back side contact solar cell using spin coated dopant sources in accordance with an embodiment of the present invention.
Figure 7B:
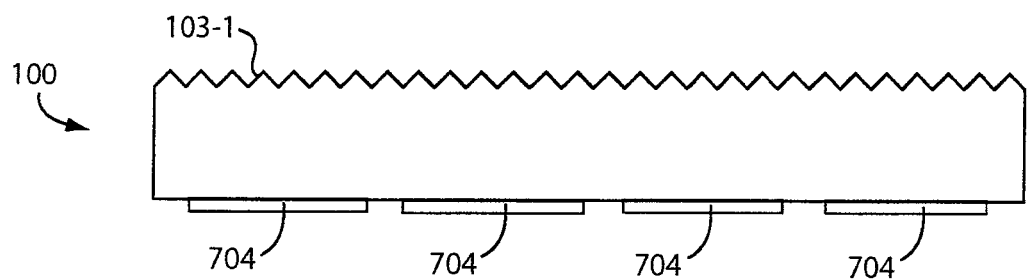
Figure 7C:
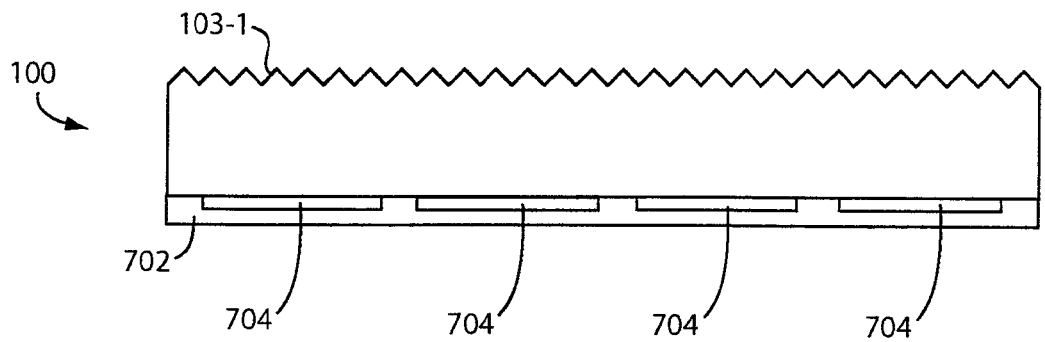
Figure 7D:
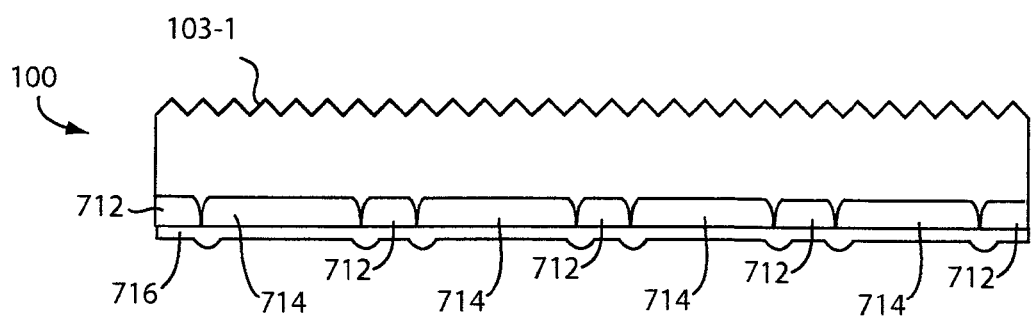

FIG. 7, which consists of FIGS. 7A, 7B, 7C, and 7D, illustrates the fabrication of active diffusion regions of a back side contact solar cell using spin coated dopant sources. In FIG. 7A, a dopant source 704 is spin coated on the entire exposed surface of the back side of wafer 100, which is opposite to the front side 103-1. The dopant source 704 may comprise SOG heavily doped with a P-type dopant and spun to a thickness of about 2 microns, for example. In FIG. 7B, the dopant source 704 is patterned to expose portions of the back side of the wafer 100 where the other dopant source is to be formed. In FIG. 7C, a dopant source 702 is spin coated over the sample of FIG. 7B. The dopant source 702 may comprise SOG heavily doped with an N-type dopant and spun to a thickness of about 2 microns on the top of the dopant source 704, for example. In FIG. 7D, a diffusion step is performed to diffuse dopants from the dopant sources 704 and 702 to the wafer 100. The diffusion step diffuses N-type dopants from the dopant source 702 into the wafer 100 to form N+ active diffusion regions 712. Similarly, the diffusion step diffuses P-type dopants from the dopant source 704 into the wafer 100 to form active diffusion regions 714. Diffusion of dopants to the wafer 100 results in dopant sources 702 and 704 transforming into an undoped dielectric layer 716.

Figure 8A:
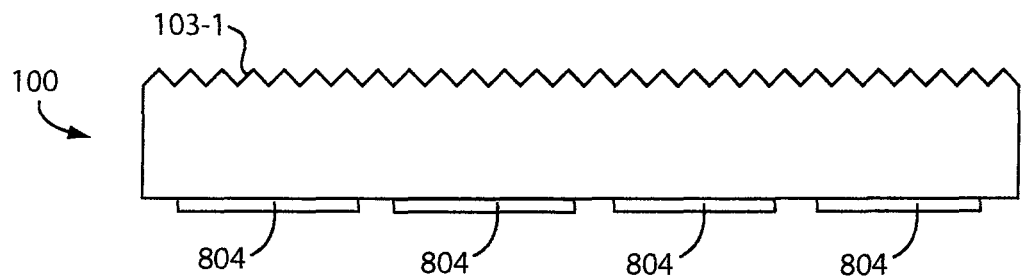
FIG. 8, which consists of FIGS. 8A, 8B, and 8C, illustrates the fabrication of active diffusion regions of a back side contact solar cell using a combination of selective deposition and other deposition processes in accordance with an embodiment of the present invention.
Figure 8B:
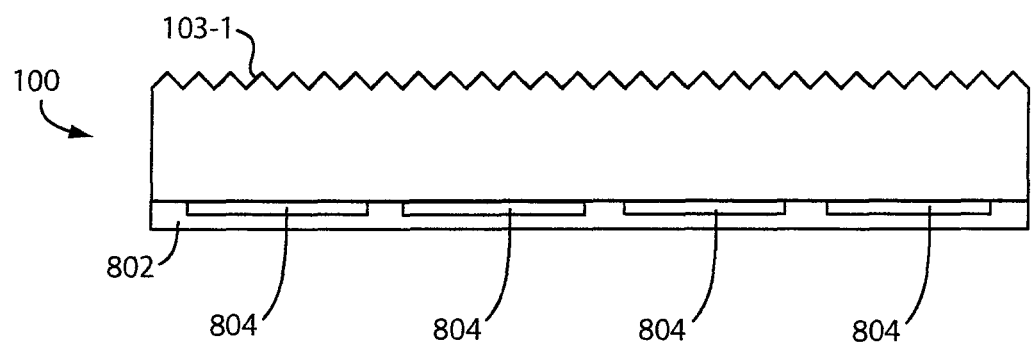
Figure 8C:
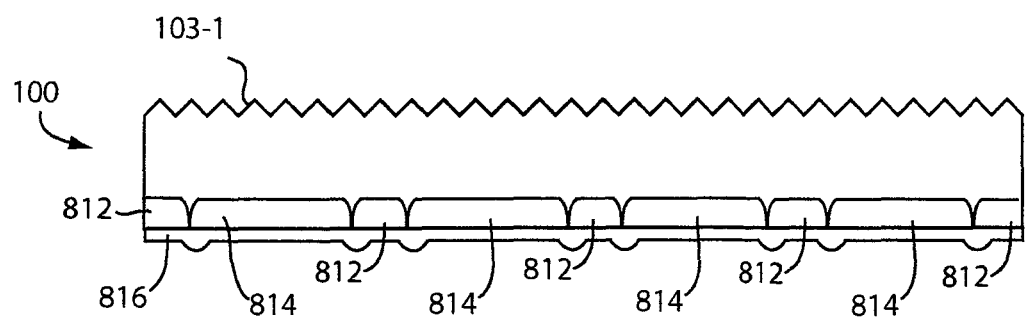

FIG. 8, which consists of FIGS. 8A, 8B, and 8C, illustrates the fabrication of active diffusion regions of a back side contact solar cell using a combination of selective deposition and other deposition processes. In FIG. 8A, dopant sources 804 are selectively deposited on the back side of the wafer 100, which is opposite the front side 103-1. The dopant sources 804 may be directly printed on the back side of the wafer 100 to a thickness of about 5 microns, for example. The dopant sources 804 may be heavily doped with a P-type dopant. Selective deposition of dopant sources 804 may be performed in a single pass of a printing process (e.g., inkjet printing or screen printing).

In FIG. 8B, a dopant source 802 is spin coated over the sample of FIG. 8A. The dopant source 802 may comprise SOG heavily doped with an N-type dopant and spun to a thickness of about 2 microns on top of the dopant sources 804, for example. Note that selective deposition of the dopant sources 804 advantageously allows the dopant source 802 to be spun without having to pattern the dopant source 804. Depending on the application, the dopant source 802 may also be applied by blanket deposition using a roll on, spray-on, screen-printing, or inkjet printing process.

In FIG. 8C, a diffusion step is performed to diffuse dopants from the dopant sources 804 and 802 to the wafer 100. The diffusion step diffuses N-type dopants from the diffusion source 802 into the wafer 100 to form N+ active diffusion regions 812. Similarly, the diffusion step diffuses P-type dopants from the dopant source 804 into the wafer 100 to form P+ active diffusion regions 814. Diffusion of dopants to the wafer 100 results in dopant sources 802 and 804 transforming into an undoped dielectric layer 816.

Figure 9C:
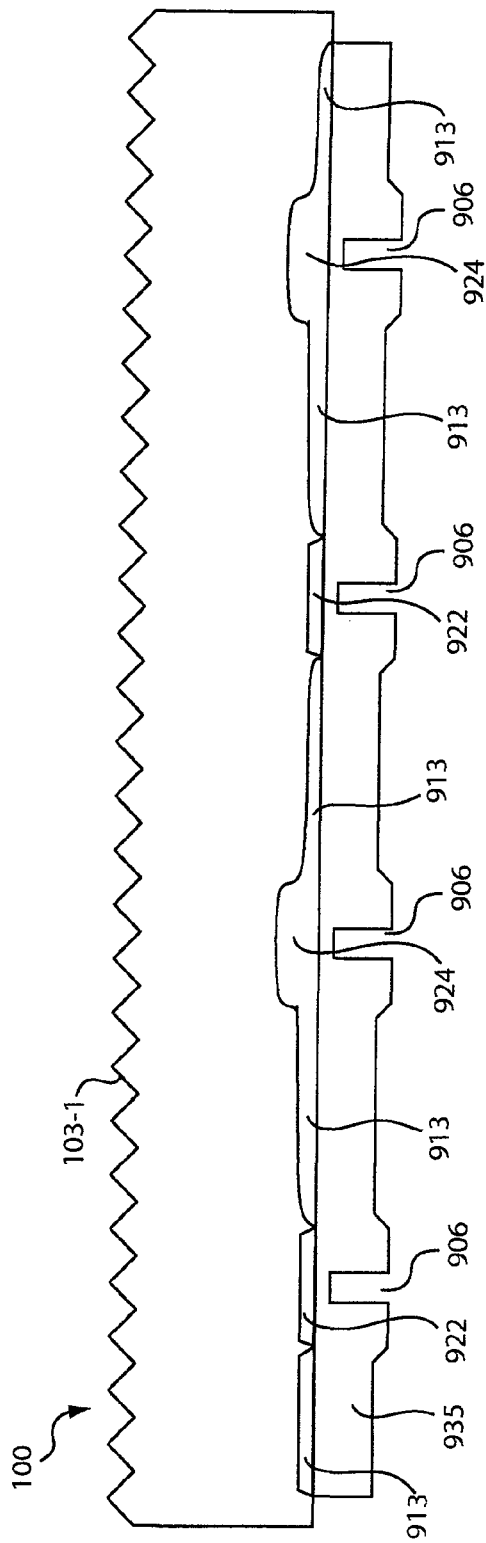
FIG. 9, which consists of FIGS. 9A, 9B, 9C, and 9D, illustrates the fabrication of active diffusion regions of a back side contact solar cell using dopant sources that allow for a self-aligned contact opening etch process in accordance with an embodiment of the present invention.
Figure 9D:
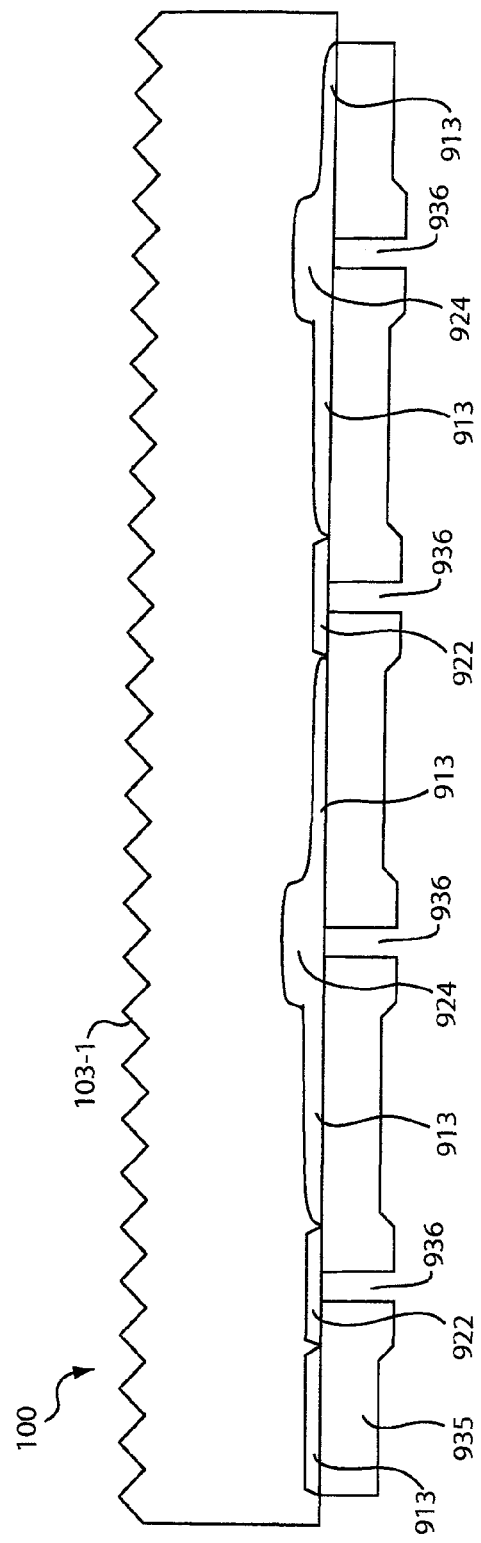

FIG. 9, which consists of FIGS. 9A, 9B, 9C, and 9D, illustrates the fabrication of active diffusion regions of a back side contact solar cell using dopant sources that allow for a self-aligned contact opening etch process.

In FIG. 9A, dopant sources 903 are formed on the back side of the wafer 100, which is opposite the front side 103-1. In one embodiment, the dopant sources 903 are formed such that the there will be openings 906 only over where heavily doped active diffusion regions will be formed (see 922 and 924 in FIG. 9C). As will be more apparent below, the relatively thick dopant sources 903 allow for a self-aligned process as the openings 906 define the location of contact openings (see 936 in FIG. 9D) to the active diffusion regions. The dopant sources 903 may be selectively deposited on the back side of the wafer 100. Preferably, the dopant sources 903 are formed on the back side of the wafer 100 by blanket deposition (e.g., by chemical vapor deposition or spin coating) followed by patterning to form the openings 906. Blanket deposition followed by patterning advantageously prevents printable dopants from touching each other.

In one embodiment, the dopant sources 903 comprise dielectric lightly doped with P-type dopants. The composition and thickness of the dopant sources 903 may be made such that after a high temperature diffusion step, the resulting P-type active diffusion regions will be lightly doped (e.g., about 250 Ohm/sq) and will generate low carrier recombination (e.g., about 25 fA/cm2 of emitter saturation current density), and the dopant sources 903 are relatively thick (e.g., about 2000 Angstroms) compared to subsequently formed dopant sources 902 and 904 (see FIG. 9B).

In FIG. 9B, dopant sources 902 and 904 are formed over the dopant sources 903 and into the openings 906. The dopant sources 902 and 904 are for forming active diffusion regions in the wafer 100 where metal gridlines will be connected. The dopant sources 902 and 904 are preferably selectively deposited by directly printing them over the back side of the wafer 100. For example, the dopant sources 902 and 904 may be selectively deposited by screen printing or inkjet printing in one pass or multiple passes. The dopant sources 902 and 904 may also be formed by blanket deposition (e.g., by chemical vapor deposition or spin coating) followed by patterning, but may require an additional etch step layer.

In one embodiment, the dopant sources 902 comprise dielectric heavily doped with an N-type dopant, while the dopant sources 904 comprise dielectric heavily doped with a P-type dopant. The composition and thickness of the dopant sources 902 and 904 may be made such that after a high temperature diffusion step, (a) the dopant sources 902 and 904 will form heavily doped (e.g., about 10 Ohm/sq) diffusion regions in the wafer 100, (b) the dopant sources 902 and 904 are relatively thin (e.g., about 500 Angstroms) compared to dopant sources 903 (see FIG. 9B), and (c) the resulting diffusion regions are opaque (i.e., the carrier recombination induced by the diffusion regions will not be significantly affected by the condition of the silicon interface at those locations).

The thicknesses of the dopant sources 903 compared to the dopant sources 902 and 904 are preferably made such that a subsequently performed contact opening etch process will etch the dopant sources 902 and 904 all the way to the wafer 100 before the dopant sources 903 are completely removed. This advantageously allows for a self-aligned contact opening etch process because the dopant sources 902 and 904 not only provide the dopant sources for the active diffusion regions, but also align the location of the contact openings. Curing steps or protection layer depositions may be performed depending on the particulars of the solar cell.

In FIG. 9C, a diffusion step is performed to diffuse dopants from the dopant sources 902, 903, and 904 to the wafer 100. The diffusion step diffuses N-type dopants from the diffusion sources 902 into the wafer 100 to form N+ active diffusion regions 922. The diffusion step also diffuses P-type dopants from the dopant sources 904 into the wafer 100 to form P+ active diffusion regions 924 and P-type dopants from the dopant sources 903 into the wafer 100 to form P− active diffusion regions 913. Diffusion of dopants to the wafer 100 results in dopant sources 902, 903, and 904 transforming into a dielectric layer 935. That is, after the diffusion step, the thicker portions of the dielectric 935 are what are left of the dopant sources 903 and the thinner portions of the dielectric 935 are what are left of dopant sources 902 and 904.

During the diffusion step, a dopant-rich gas (e.g., POCl3) and some oxygen may be introduced into the furnace during selected times to form a light N-type diffusion and to grow a thermal oxide layer on the front side 103-1. The N-type diffusion and the thermal oxide on the front side 103-1 help reduce recombination on the textured-side of the solar cell.

In FIG. 9D, the sample of FIG. 9C is subjected to a self-aligned contact opening etch step to remove portions of the dielectric layer 935 over the active diffusion regions 922 and 924. The contact opening etch step forms contact openings 936 through the previously described contact openings 906 (see FIG. 9C). The contact opening etch step may be designed to thin down portions of the dielectric layer 935 in the contact openings 906 to form the contact openings 936. Because the dopant sources 902 and 904 were made thinner than the dopant sources 903, the contact opening etch step thins the thicker portions of the dielectric layer 935 but completely removes the thinner portions of the dielectric layer 935. Metal gridlines may be formed in the contact openings 936 to electrically connect to the active diffusion regions 922 and 924.

In one embodiment, the contact opening etch step comprises a timed wet etch process. For example, the contact opening etch step may be performed by subjecting the back side (i.e., the non-textured side) of the sample of FIG. 9C to an HF-rich etchant (liquid or vapor) during a controlled amount of time. In general, any etchant that will produce a controllable etch rate of the dielectric layer 935 may be used. In applications where it is impractical to etch on one-side only, an additional protective layer may be deposited on the textured front side 103-1 to protect it during the contact opening etch. A plasma etcher may also be used to etch the back side of the wafer 100 without etching the front side 103-1. The plasma etching step may be integrated with a subsequent metal sputter step for forming metal gridlines in the contact openings 936. For example, a cluster tool may have a first chamber for performing the plasma etch step and another chamber for forming the metal gridlines.

In an alternative embodiment, the relatively thin dopant sources for forming the active diffusions may be formed first, followed by the thicker dopant sources. For example, the thicker dopant sources 903 may be formed over the back side of the wafer 100 after the thinner dopant sources 902 and 904. However, the embodiment of FIGS. 9A-9D is preferable because it allows for a true self-aligned process and prevents mixing of printable dopants.

While specific embodiments of the present invention have been provided, it is to be understood that these embodiments are for illustration purposes and not limiting. Many additional embodiments will be apparent to persons of ordinary skill in the art reading this disclosure.

What is claimed is:

1. A method of fabricating a solar cell, the method comprising:
   texturing a front side of a wafer, the front side being configured to face the sun to collect solar radiation during normal operation;
   selectively forming by inkjet printing a first dopant source and a second dopant source on a back side of the wafer after texturing the front side of the wafer, the first and second dopant sources being formed touching each other and having differing polarity; and
   diffusing dopants from the first dopant source to form a first active diffusion region of the solar cell and dopants from the second dopant source to form a second active diffusion region of the solar cell.

2. The method of claim 1 wherein texturing the front side of the wafer comprises:
   thinning the front side and the back side of the wafer to partially remove damaged portions of the wafer on the front side and the back side;

texturing the front side and the back side of the wafer to remove remaining damaged portions on the front side and on the back side of the wafer; and polishing the back side of the wafer to remove the texturing on the back side of the wafer.

3. The method of claim 1 wherein the first and second dopant sources are formed in one pass of an inkjet printing process.

4. The method of claim 1 further comprising:

selectively forming by inkjet printing a third dopant source and a fourth dopant source, the third dopant source having a same polarity as the first dopant source, the fourth dopant source having a same polarity as the second dopant source.

5. The method of claim 4 wherein the first, second, third, and fourth dopant sources are formed in one pass of an inkjet printing process.

6. The method of claim 4 wherein the third dopant source has higher dopant concentration than the first dopant source, and the fourth dopant source has higher dopant concentration than the second dopant source.

7. The method of claim 4 wherein the first dopant source comprises a lightly doped P-type dopant and the third dopant source comprises a heavily doped P-type dopant.

8. The method of claim 4 wherein the second dopant source comprises a lightly doped N-type dopant and the fourth dopant source comprises a heavily doped N-type dopant.

9. A method of fabricating a solar cell, the method comprising:

selectively forming a first dopant source, a second dopant source, and a third dopant source having a same polarity on a back side of a wafer, the second dopant source being adjacent and between the first and third dopant sources, the second dopant source having higher dopant concentration than the first and third dopant sources; and diffusing dopants from the first, second, and third dopant sources to form a first active diffusion region of the solar cell.

10. The method of claim 9 wherein the first, second and third dopant sources are formed in a single pass of an inkjet printing process.

11. The method of claim 9 wherein the first and third dopant sources comprise a lightly doped P-type dopant and the second dopant source comprises a heavily doped P-type dopant.

12. The method of claim 9 further comprising:

selectively forming a fourth dopant source, a fifth dopant source, and a sixth dopant source having a same polarity on the back side of the wafer, the fifth dopant source being adjacent and between the fourth and sixth dopant sources, the fifth dopant source having higher dopant concentration than the fourth and sixth dopant sources, the fourth, fifth, and sixth dopant sources having different polarity compared to the first, second, and third dopant sources; and diffusing dopants from the fourth, fifth, and sixth dopant sources to form a second active diffusion region of the solar cell.

13. The method of claim 12 wherein the fourth and sixth dopant sources comprise a lightly doped N-type dopant and the fifth dopant source comprises a heavily doped N-type dopant.

14. The method of claim 12 wherein the first, second, third, fourth, fifth, and sixth dopant sources are formed in a single pass of an inkjet printing process.

* * * * *